(12) United States Patent
Hohensee et al.

(10) Patent No.: US 9,489,152 B2
(45) Date of Patent: Nov. 8, 2016

(54) OBJECT DISTRIBUTION IN ADVANCED FUNCTION PRESENTATION ENVIRONMENTS

(71) Applicants: Reinhard Hohensee, Boulder, CO (US); Harry Reese Lewis, Longmont, CO (US); Michael Glen Lotz, Longmont, CO (US)

(72) Inventors: Reinhard Hohensee, Boulder, CO (US); Harry Reese Lewis, Longmont, CO (US); Michael Glen Lotz, Longmont, CO (US)

(73) Assignee: Ricoh Company, Ltd., Tokyo (JP)

( * ) Notice: Subject to any disclaimer, the term of this patent is extended or adjusted under 35 U.S.C. 154(b) by 20 days.

(21) Appl. No.: 14/187,805

(22) Filed: Feb. 24, 2014

(65) Prior Publication Data

US 2015/0244895 A1    Aug. 27, 2015

(51) Int. Cl.
  *G06F 3/12*    (2006.01)
(52) U.S. Cl.
  CPC ...................... *G06F 3/12* (2013.01)
(58) Field of Classification Search
  CPC ....... H04N 1/21; H04N 2201/21; G06F 3/12
  USPC ...................................................... 358/1.15
  See application file for complete search history.

(56) References Cited

U.S. PATENT DOCUMENTS

| 6,538,760 | B1 | 3/2003 | DeBry |
| 7,466,441 | B2 | 12/2008 | Barry |
| 7,711,834 | B2 | 5/2010 | Gormish |
| 8,112,390 | B2 | 2/2012 | Gejodos |
| 2003/0182623 | A1* | 9/2003 | Lynch ................ G06F 17/227 715/234 |
| 2007/0211293 | A1 | 9/2007 | Komamura |
| 2008/0037047 | A1* | 2/2008 | Condon et al. ............ 358/1.13 |
| 2009/0313256 | A1 | 12/2009 | Konduri |
| 2012/0005252 | A1 | 1/2012 | Canessa |
| 2015/0244895 | A1* | 8/2015 | Hohensee ................ H04N 1/21 358/1.16 |

OTHER PUBLICATIONS

Mixed Object Document Content Architecture (MO:DCA) Reference, Ninth Edition (Jul. 2011), Advanced Function Presentation Consortium.

* cited by examiner

*Primary Examiner* — Kent Yip
(74) *Attorney, Agent, or Firm* — Duft Bornsen & Fettig LLP

(57) ABSTRACT

Systems and methods are provided for indexing in Advanced Function Presentation (AFP) systems. One embodiment is a system that includes a memory and a controller. The memory may store Advanced Function Presentation (AFP) print data. The controller may load the AFP print data, detect an AFP Object Container Data (OCD) structured field within the print data, and follow a pointer from within the OCD structured field to a global reference. The controller may also acquire Metadata Object Content Architecture (MOCA) header information within the global reference, and process the OCD structured field based on the MOCA header information within the global reference.

20 Claims, 8 Drawing Sheets

OBJECT DISTRIBUTION IN ADVANCED FUNCTION PRESENTATION ENVIRONMENTS

FIELD OF THE INVENTION

The invention relates to the field of printing, and in particular, to Advanced Function Presentation (AFP) print data.

BACKGROUND

Advanced Function Presentation (AFP) is a format used to store print data for print jobs. According to AFP standards, a print job is divided into AFP objects. Each AFP object may define a part of the print job, such as a document, a page, an image, text, etc. Furthermore, AFP objects may be nested within each other. For example, an AFP document object may include multiple AFP page objects, and each AFP page object may include multiple text and/or graphical objects.

Each AFP print job may be associated with metadata. Metadata is contextual information that describes the print job. For example, metadata may indicate an author of the print job, may indicate a preferred rasterization algorithm to use while processing the print job, or may indicate any other suitable characteristic of the print job. One exemplary format for metadata is defined by the Metadata Object Content Architecture (MOCA) standards set by the AFP Consortium.

Each MOCA object within AFP print data is stored as one or more Object Container Data (OCD) structured fields that are bounded by a Begin Object Container (BOC) structured field and an End Object Container (EOC) structured field. The first OCD structured field for the MOCA object stores a MOCA header, and this MOCA header describes a format for the MOCA object, a type of metadata held by the MOCA object, etc. A MOCA header is often between about fifty and three hundred bytes in size. Large AFP print jobs may include hundreds of thousands, or even millions of MOCA objects, each having its own header.

SUMMARY

Embodiments described herein use referencing to acquire MOCA header information from a global reference, instead of separately storing the MOCA header information for each MOCA object. Since MOCA objects often utilize the same header information, significant space savings may be achieved when they are linked in this manner. Simply put, one global reference may store header information for many MOCA objects. Thus, MOCA header information need not be duplicated among different MOCA objects, which significantly reduces the size of an AFP print file.

One embodiment is a system comprising a memory and a controller. The memory is able to store Advanced Function Presentation (AFP) print data. The controller is able to load the AFP print data, to detect an AFP Object Container Data (OCD) structured field within the print data, to follow a pointer from within the OCD structured field to a global reference within the print data, and to acquire Metadata Object Content Architecture (MOCA) header information within the global reference. The controller is also able to process the OCD structured field based on the MOCA header information within the global reference.

In a further embodiment, the global reference is an OCD structured field that includes a MOCA header.

In a further embodiment, the controller is able to identify the pointer as a Fully Qualified Name (FQN) triplet.

In a further embodiment, the global reference is an OCD structured field, and the controller is able to identify a Begin Object Container (BOC) structured field with an FQN that matches the FQN triplet and immediately precedes the global reference.

In a further embodiment, the MOCA header information defines a format for Extensible Markup Language (XML) data within the OCD structured field.

In a further embodiment, the MOCA header information indicates that XML data within the OCD structured field is formatted according to an Extensible Metadata Platform (XMP) standard.

In a further embodiment, the pointer is one of multiple pointers across multiple OCD structured fields that point to the global reference.

In a further embodiment, the global reference and the OCD structured field are both located within an index for the AFP print data.

In a further embodiment, the global reference and the OCD structured field are both located within a document defined by the AFP print data.

In a further embodiment, the OCD structured field is not bounded by a Begin Object Container (BOC) structured field and End Object Container (EOC) structured field.

Another embodiment is a method. The method includes loading Advanced Function Presentation (AFP) print data from a memory, detecting an AFP Object Container Data (OCD) structured field within the print data, following a pointer from within the OCD structured field to a global reference within the print data, and acquiring Metadata Object Content Architecture (MOCA) header information within the global reference. The method also includes processing the OCD structured field based on the MOCA header information within the global reference.

Another embodiment is a system comprising a memory and a controller. The memory is able to store Advanced Function Presentation (AFP) print data. The controller is able to load the AFP print data, to detect a Metadata Object Content Architecture (MOCA) object within the print data, to follow a pointer from the MOCA object to a global reference within the print data, and to acquire MOCA header information within the global reference. The controller is also able to process the MOCA object based on the MOCA header information within the global reference.

Another embodiment is a method. The method includes loading Advanced Function Presentation (AFP) print data from a memory, detecting a Metadata Object Content Architecture (MOCA) object within the print data, following a pointer from the MOCA object to a global reference within the print data, and acquiring MOCA header information within the global reference. The method also includes processing the MOCA object based on the MOCA header information.

Another embodiment is a non-transitory computer readable medium embodying programmed instructions which, when executed by a processor, are operable for performing a method described above.

Other exemplary embodiments (e.g., methods and computer-readable media relating to the foregoing embodiments) may be described below.

DESCRIPTION OF THE DRAWINGS

Some embodiments of the present invention are now described, by way of example only, and with reference to the accompanying drawings. The same reference number represents the same element or the same type of element on all drawings.

DETAILED DESCRIPTION

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention, and are to be construed as being without limitation to such specifically recited examples and conditions. As a result, the invention is not limited to the specific embodiments or examples described below, but by the claims and their equivalents.

Figure 1:
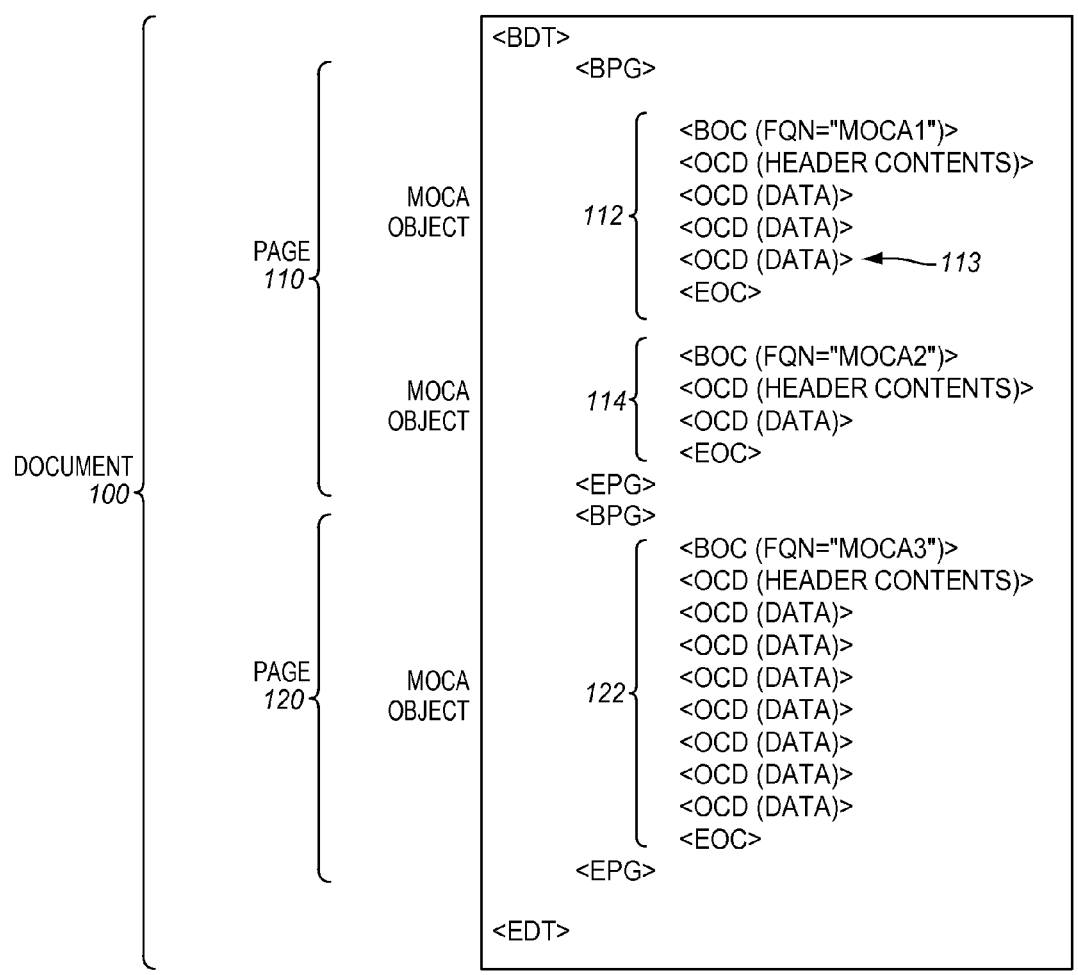
FIG. 1 is a diagram illustrating AFP print data in an exemplary embodiment.

FIG. 1 provides a general illustration of AFP print data, MOCA objects, and OCD structured fields that may be processed by a computer system. FIG. 1 depicts an AFP document 100 which is initiated by a Begin Document (BDT) structured field and completed by an End Document (EDT) structured field. The document includes two pages (110 and 120), which are each initiated by a Begin Page (BPG) structured field and completed by an End Page (EPG) structured field.

Each page includes one or more MOCA objects (112, 114, and 122), which store metadata for the AFP document. The MOCA objects are themselves each defined by a Begin Object Container (BOC) structured field, one or more Object Container Data (OCD) structured fields, and an End Object Container (EOC) structured field.

Within each MOCA object, one or more OCD structured fields (e.g., 113) store MOCA header information, while remaining OCD structured fields are used to store payload data for the MOCA object. For example, a MOCA object that defines alternative text for an image within the print data may include one OCD structured field that stores header information, and may include multiple following payload OCD structured fields that store the alternative text itself.

MOCA objects are used to store various types of metadata for AFP print jobs. As used herein, the term "metadata" refers to information that describes AFP print data. This information may be classified as descriptive or operational in nature. Operational metadata recites commands that will be followed by a printing system when processing associated print data, even though the metadata itself does not appear on the final printed page. Descriptive metadata is different than operational metadata because, while descriptive metadata may provide contextual information (such as processing "hints" that suggest how to rasterize an image), descriptive metadata does not require that print data be processed in a specific way.

Figure 2:
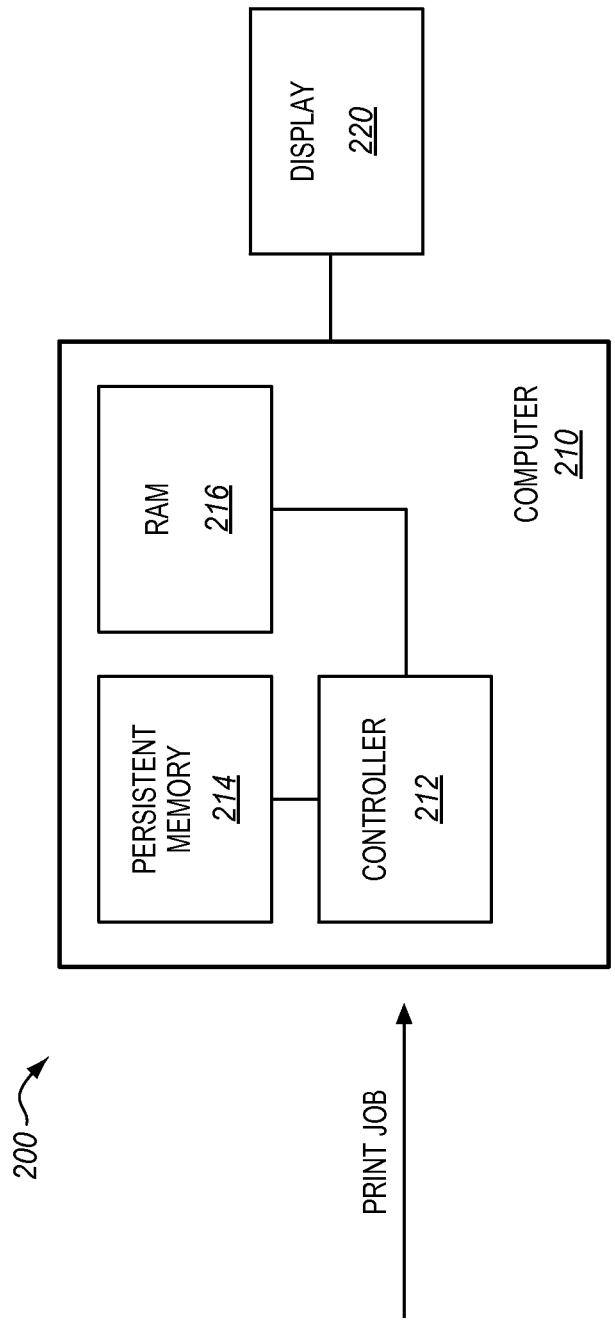
FIG. 2 is a block diagram of a computer system in an exemplary embodiment.

FIG. 2 is a block diagram of a computer system 200 in an exemplary embodiment. Computer system 200 comprises any system, device, or component operable to generate and/or process AFP print data, such as a computer, a server, a network, etc. Computer system 200 may be used by a print shop operator to review, create, and/or modify AFP print jobs.

Computer system 200 has been enhanced to utilize referencing for MOCA header information, instead of independently storing MOCA header information in each MOCA object. For example, computer system 200 may use a pointer from an OCD structured field of a "partial" MOCA object to reference MOCA header information stored in an OCD structured field for a "master" MOCA object, and thereby create a distributed MOCA object.

In this embodiment, computer system 200 includes computer 210. Computer 210 comprises controller 212, persistent memory 214, and Random Access Memory (RAM) 216. Controller 212 manages the operations of computer 210, and may be implemented, for example, as custom circuitry or as a processor executing programmed instructions. Controller 212 may use persistent memory 214 (e.g., a disk drive) to store print data for later retrieval. In one embodiment, controller 212 uses RAM 216 to actively load and process portions of AFP print data kept in persistent memory 214. Controller 212 may further utilize display 220 (e.g., a monitor, screen, etc.) in order to visually show print data to a user. Additional devices, such as audio devices, printers, or multimedia devices (e.g., televisions, etc.) may be used to present information as desired.

The particular arrangement, number, and configuration of components described herein is exemplary and non-limiting. Illustrative details of the operation of computer system 200 will be discussed with regard to FIGS. 3 and 4. Assume, for this embodiment, that computer system 200 has identified an AFP print job for processing.

Figure 3:
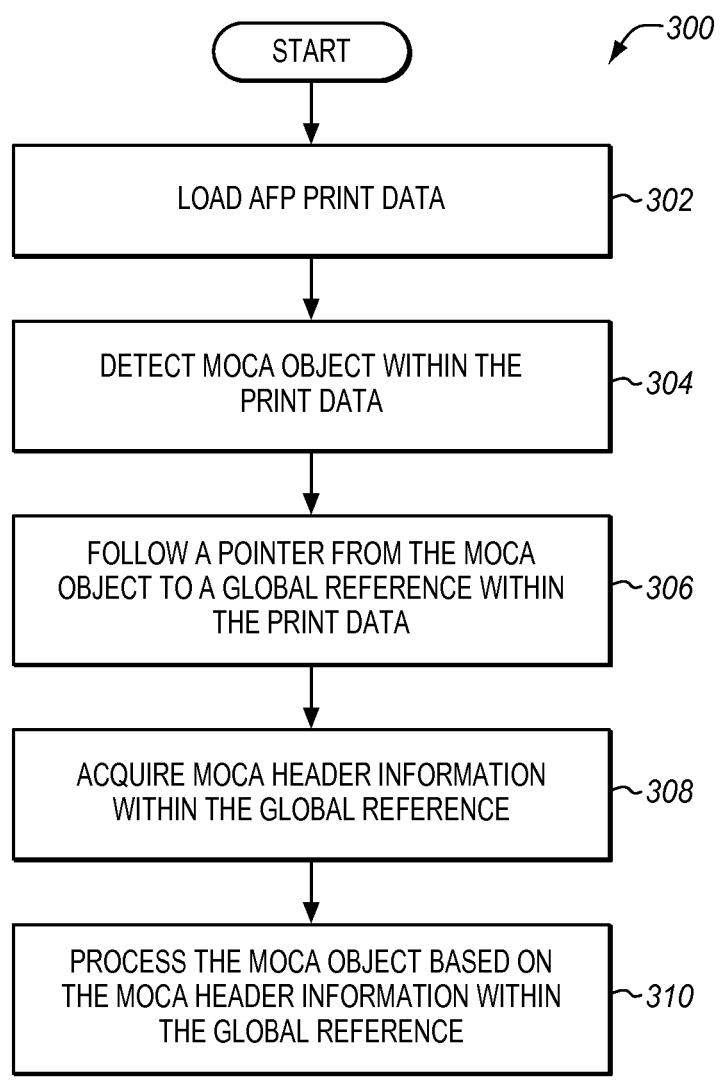
FIG. 3 is a flowchart illustrating a method for operating a computer system to process AFP print data in an exemplary embodiment.

FIG. 3 is a flowchart illustrating a method 300 for processing AFP print data in an exemplary embodiment. The steps of method 300 are described with reference to computer system 200 of FIG. 2, but those skilled in the art will appreciate that method 300 may be performed in other systems. The steps of the flowcharts described herein are not all inclusive and may include other steps not shown. The steps described herein may also be performed in an alternative order.

In step 302, controller 212 loads AFP print data for processing (e.g., from persistent memory 214 into RAM 216). Individual structured fields of the AFP print data are then processed by controller 212, which analyzes the print data in order to rasterize it, review it, and/or perform any other suitable operations.

In step 304, controller 212 detects a partial MOCA object within the print data. The partial MOCA object may be detected in any suitable manner, such as by parsing each structured field of the AFP print data until a BOC structured field or OCD structured field is encountered. The detected structured field may in turn include a flag or other identifier indicating that it acts as a partial MOCA object.

Once the partial MOCA object has been detected, MOCA header information may be desired in order to determine how to properly process/interpret the contents of the partial MOCA object. To this end, in step 306 controller 212 follows a pointer from the partial MOCA object to a global reference.

The pointer may be any suitable data structure capable of referring to the global reference. In one embodiment, the pointer may comprise a Fully Qualified Name (FQN) triplet which refers to the global reference. For example the FQN triplet may refer to a master MOCA object that serves as the global reference (e.g., by matching an FQN triplet on a BOC structured field for the global reference).

In another embodiment, the pointer may comprise a byte location within the AFP print data, etc. If the pointer refers to a byte location, controller 212 may travel to the byte location in order to access the global reference.

The global reference may comprise any suitable structures within the AFP print data that are separate from the detected partial MOCA object. For example, the global reference may comprise a separately defined master MOCA object, an OCD structured field, etc.

In step 308, controller 212 acquires MOCA header information within the global reference. The MOCA header information describes the formatting/encoding scheme for the partial MOCA object, and may describe an "XML context," which indicates how to process different XML tags/commands. For example, a MOCA header may indicate encoding in Extensible Markup Language (XML) according to the Extensible Metadata Platform (XMP) standard.

In step 310, controller 212 processes the partial MOCA object based on the MOCA header information from the global reference. Controller 212 uses the information from the MOCA header in order to process the partial MOCA object. For example, controller 212 may process the partial MOCA object in accordance with a metadata format and type defined by the MOCA header in the global reference.

Figure 4:
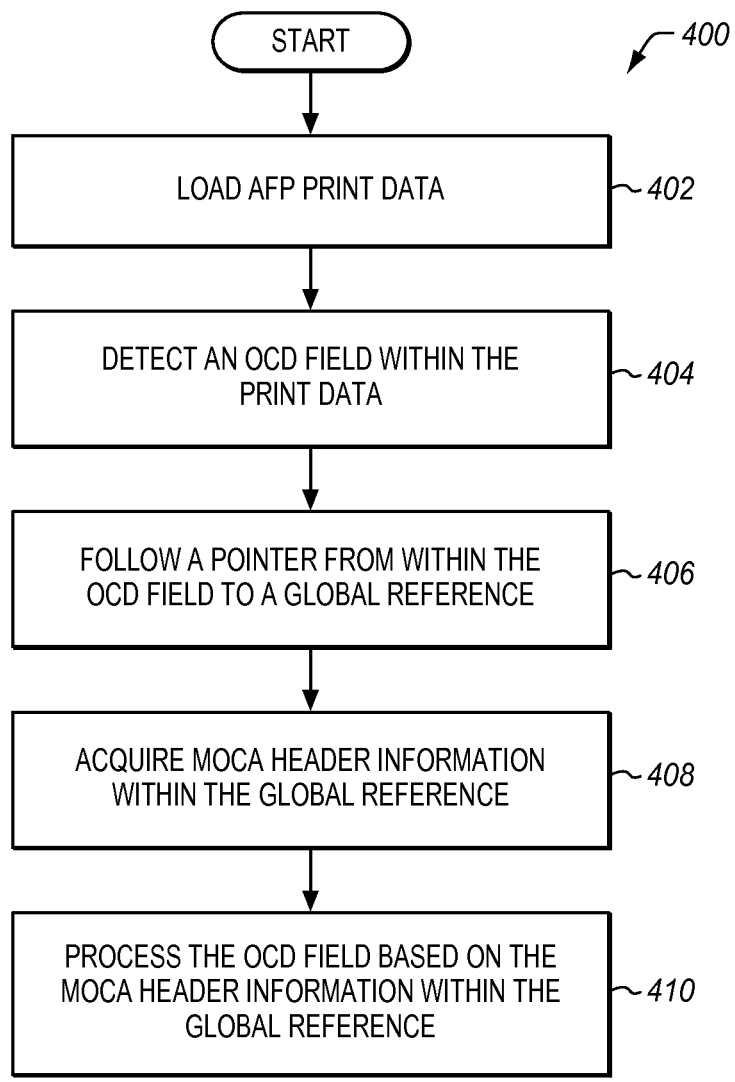
FIG. 4 is a flowchart illustrating a method for operating a computer system to process OCD structured fields that carry partial MOCA objects in an exemplary embodiment.

FIG. 4 illustrates a technique for MOCA object referencing which is specifically tied to OCD structured fields that carry partial MOCA objects. Specifically, FIG. 4 is a flowchart illustrating a method 400 for processing OCD structured fields in an exemplary embodiment. The steps of method 400 are described with reference to computer system 200 of FIG. 1, but those skilled in the art will appreciate that method 400 may be performed in other systems. The steps of the flowcharts described herein are not all inclusive and may include other steps not shown. The steps described herein may also be performed in an alternative order.

In step 402, controller 212 loads AFP print data for processing.

In step 404, controller 212 detects an OCD structured field within the print data. The OCD structured field may be detected in any suitable manner, such as by parsing each structured field of the AFP print data until an OCD structured field is encountered. The OCD structured field defines a partial MOCA object, and may or may not be bounded by a BOC structured field and EOC structured field.

Once the OCD structured field has been detected, MOCA header information may be desired in order to determine how to properly process/interpret the contents of the OCD structured field. To this end, in step 406 controller 212 follows a pointer from within the OCD structured field to a global reference. For example, if the global reference is an OCD structured field, the pointer may comprise a Fully Qualified Name (FQN) triplet that matches an FQN triplet on the BOC that immediately precedes the global reference.

The global reference may comprise any suitable structures within the AFP print data that are separate from the detected OCD structured field (and its corresponding partial MOCA object).

In step 408, controller 212 acquires MOCA header information within the global reference.

In step 410, controller 212 processes the OCD structured field based on the MOCA header information within the global reference. For example, controller 212 may process the contents of the detected OCD structured field in accordance with a metadata format and type defined by the MOCA header in the global reference.

Using methods 300 or 400, computer system 200 may process enhanced AFP files that are substantially smaller than AFP files which do not utilize distributed MOCA objects. Furthermore, methods 300 and 400 enhance the ease with which MOCA objects can be generated and/or revised for AFP print data. Since each OCD may refer back to a MOCA header instead of defining its own, the generation and manipulation of MOCA objects (even in large numbers) becomes a straightforward process.

In a further embodiment, the OCD structured field detected by controller 212 in step 404 is not bounded by a BOC or EOC structured field, which means that the individual OCD structured field itself operates as a partial MOCA object. In such cases, the global reference may comprise an OCD structured field that is bounded by BOC and EOC structured fields. In such cases, information from the BOC and EOC structured fields may be used to process the OCD structured field that was detected in step 404.

EXAMPLES

In the following example, additional processes, systems, and methods are described in the context of a system for processing AFP print jobs. Assume, for this example, that AFP print data has been loaded into a computer system for processing.

Figure 5:
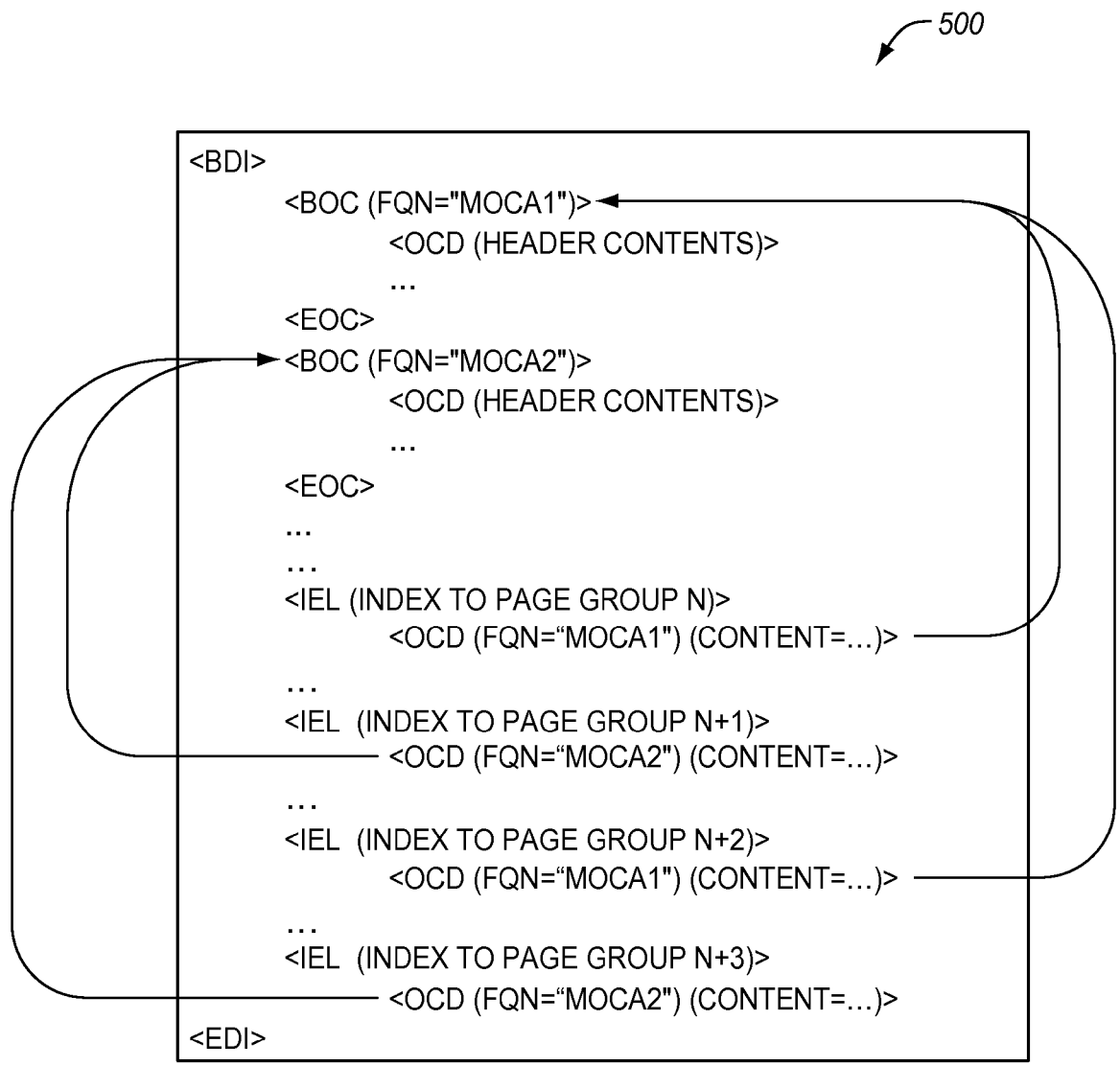
FIG. 5 is a diagram illustrating MOCA object referencing within AFP print data in an exemplary embodiment.

FIG. 5 is a diagram 500 illustrating MOCA object referencing within AFP print data in an exemplary embodiment. As shown in FIG. 5, the MOCA objects are arranged within an index for an AFP print job. The index itself is bounded by a Begin Document Index (BDI) structured field and End Document Index (EDI) structured field, and precedes an AFP document. The document index includes multiple global references.

In this example, each global reference is an OCD structured field of a MOCA object. Each of the global references is bounded by a BOC structured field and EOC structured field, and each global reference includes a flag that indicates it is part of a master MOCA object. Meanwhile, the OCD structured fields which refer back to master MOCA objects each include their own flag to indicate that they represent a partial MOCA object.

As shown in FIG. 5, the OCD structured fields that follow the global references use FQN triplets to refer back to their master MOCA objects by name. The name for each master object is stored in an FQN triplet within its corresponding BOC structured field. In this manner, a computer system may quickly review the index, acquire MOCA header information from a master MOCA object within the index, and utilize the header information when processing a following partial MOCA object.

As shown in FIG. 5, the partial MOCA objects that follow the document index are not accompanied by/bounded by BOC or EOC structured fields. Instead, when these partial MOCA objects (represented by OCD structured fields) are processed, contextual information from the BOC and/or EOC structured fields of their corresponding master MOCA objects is used.

Figure 6:
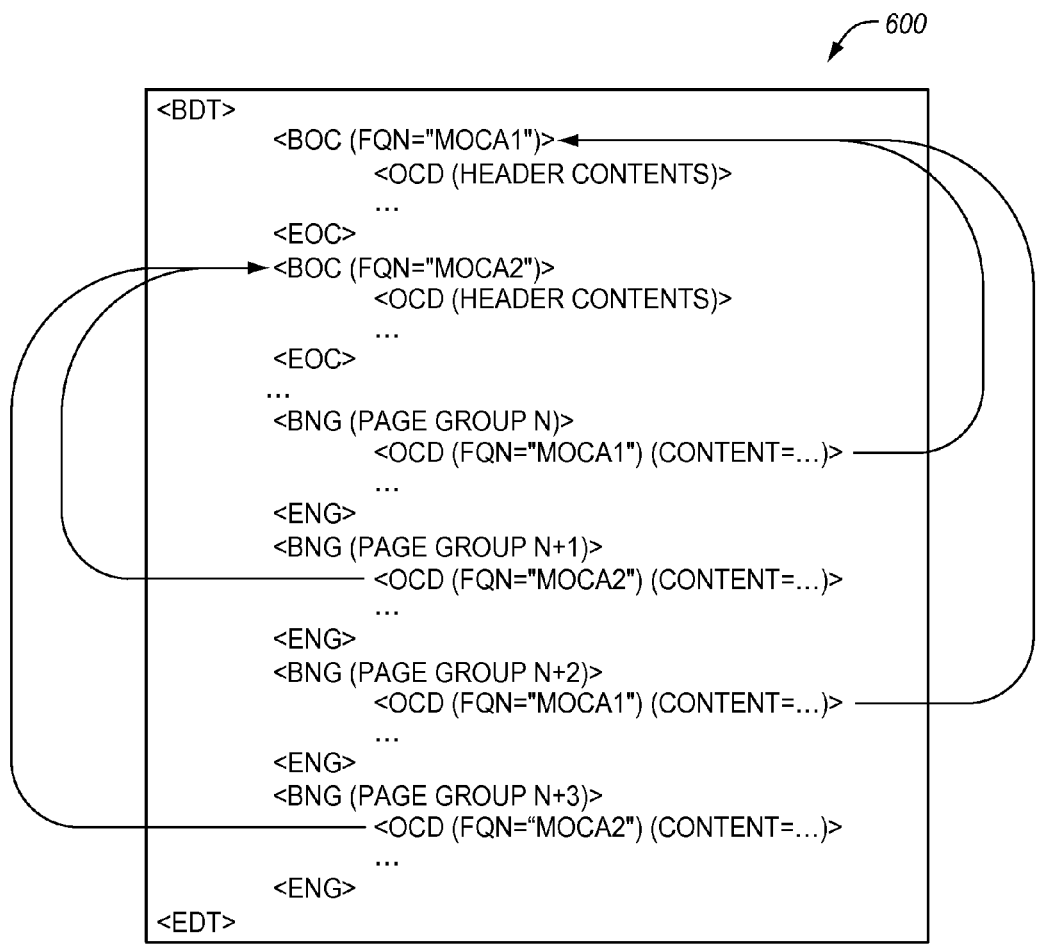
FIG. 6 is another diagram illustrating MOCA object referencing within AFP print data in an exemplary embodiment.

FIG. 6 is another diagram 600 illustrating MOCA object referencing within AFP print data in an exemplary embodiment. According to FIG. 6, the distributed MOCA objects are kept/stored within an AFP document bounded by a Begin Document (BDT) structured field and an End Document (EDT) structured field. In this embodiment, each master MOCA object is stored at the beginning of the document. Meanwhile, partial MOCA objects (in the form of individual OCD fields) are placed at the beginning of each page group within the document, and utilize an FQN to refer back to their corresponding master MOCA object. As shown herein, individual page groups are bounded by Begin Named Group (BNG) and End Named Group (ENG) structured fields.

Figure 7:
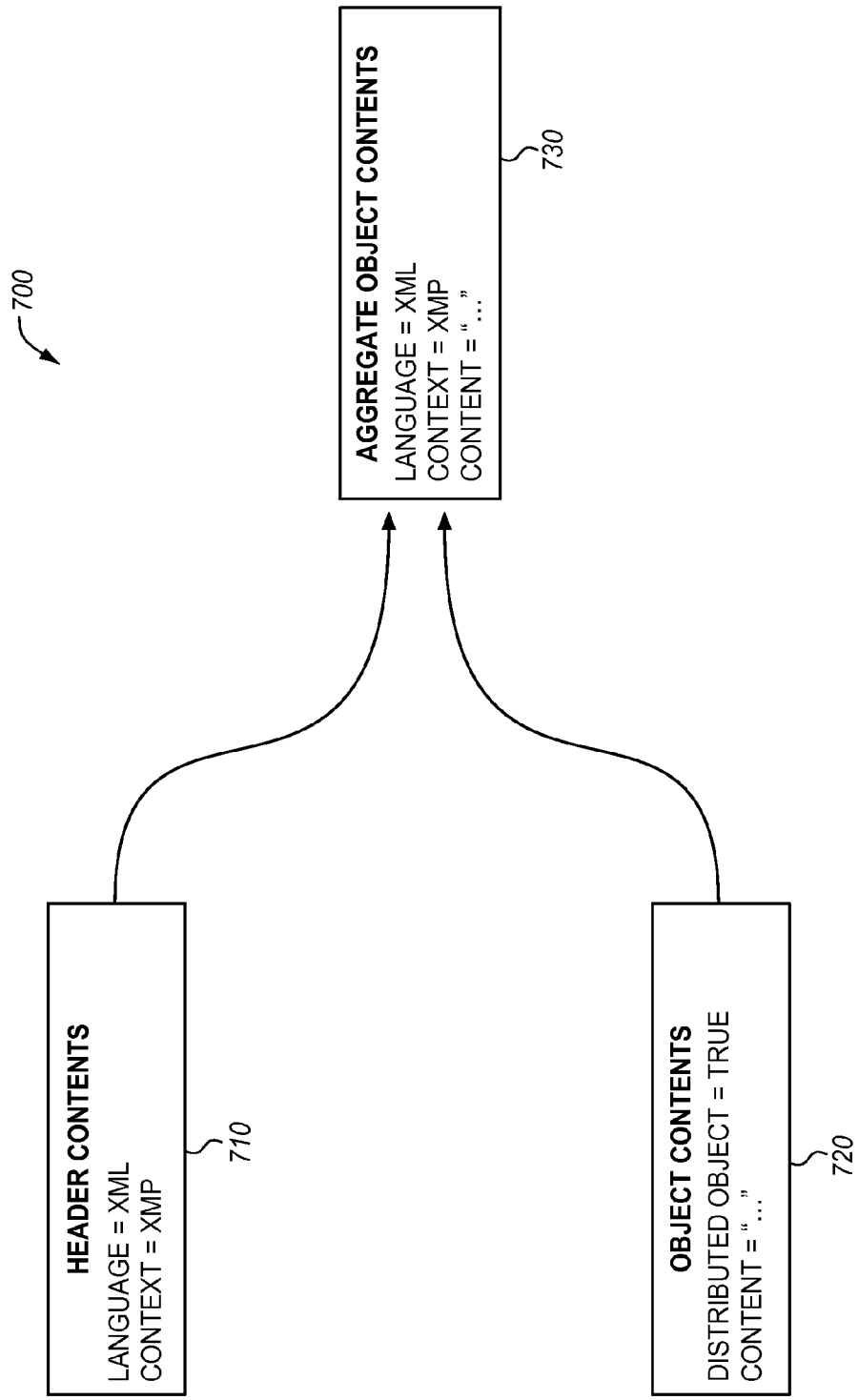
FIG. 7 is a diagram illustrating an aggregate MOCA object in an exemplary embodiment.

FIG. 7 is a diagram 700 illustrating an aggregate MOCA object in an exemplary embodiment. The aggregate MOCA object 730, interpreted by a computer system, is processed according to the language and context shown in MOCA header 710, and includes object contents 720 which are located at a separate location within the AFP print data.

Figure 8:
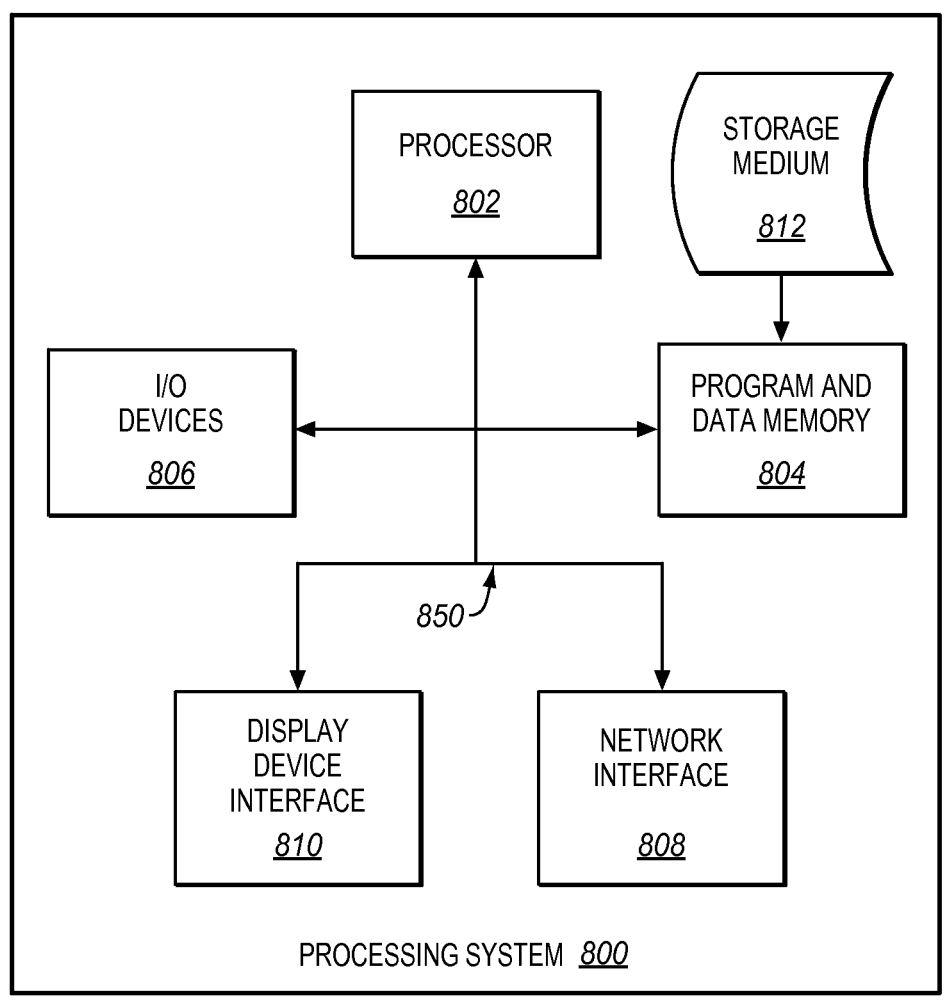
FIG. 8 illustrates a processing system operable to execute a computer readable medium embodying programmed instructions to perform desired functions in an exemplary embodiment.

Embodiments disclosed herein can take the form of software, hardware, firmware, or various combinations thereof. In one particular embodiment, software is used to direct a processing system of computer system 100 to perform the various operations disclosed herein. FIG. 8 illustrates a processing system 800 operable to execute a computer readable medium embodying programmed instructions to perform desired functions in an exemplary embodiment. Processing system 800 is operable to perform the above operations by executing programmed instructions tangibly embodied on computer readable storage medium 812. In this regard, embodiments of the invention can take the form of a computer program accessible via computer-readable medium 812 providing program code for use by a computer or any other instruction execution system. For the purposes of this description, computer readable storage medium 812 can be anything that can contain or store the program for use by the computer.

Computer readable storage medium 812 can be an electronic, magnetic, optical, electromagnetic, infrared, or semiconductor device. Examples of computer readable storage medium 812 include a solid state memory, a magnetic tape, a removable computer diskette, a random access memory (RAM), a read-only memory (ROM), a rigid magnetic disk, and an optical disk. Current examples of optical disks include compact disk-read only memory (CD-ROM), compact disk—read/write (CD-R/W), and DVD.

Processing system 800, being suitable for storing and/or executing the program code, includes at least one processor 802 coupled to program and data memory 804 through a system bus 850. Program and data memory 804 can include local memory employed during actual execution of the program code, bulk storage, and cache memories that provide temporary storage of at least some program code and/or data in order to reduce the number of times the code and/or data are retrieved from bulk storage during execution.

Input/output or I/O devices 806 (including but not limited to keyboards, displays, pointing devices, etc.) can be coupled either directly or through intervening I/O controllers. Network adapter interfaces 808 may also be integrated with the system to enable processing system 800 to become coupled to other data processing systems or storage devices through intervening private or public networks. Modems, cable modems, IBM Channel attachments, SCSI, Fibre Channel, and Ethernet cards are just a few of the currently available types of network or host interface adapters. Display device interface 810 may be integrated with the system to interface to one or more display devices, such as printing systems and screens for presentation of data generated by processor 802.

Although specific embodiments were described herein, the scope of the invention is not limited to those specific embodiments. The scope of the invention is defined by the following claims and any equivalents thereof.

We claim:

1. A system comprising:
a memory configured to store Advanced Function Presentation (AFP) print data; and
a controller configured to load the AFP print data, to detect an AFP Object Container Data (OCD) structured field storing a Metadata Object Content Architecture (MOCA) object within the print data, to follow a pointer from within the OCD structured field to a separately stored header for the MOCA object that is located outside of the OCD structured field and stores header information for multiple MOCA objects, to acquire the header information, which is defined by MOCA specifications, and to process the OCD structured field based on the header information within the header.

2. The system of claim 1, wherein:
the header is included within an OCD structured field.

3. The system of claim 1, wherein:
the controller is configured to identify the pointer as a Fully Qualified Name (FQN) triplet.

4. The system of claim 3, wherein:
the header is within an OCD structured field; and
the controller is configured identify a Begin Object Container (BOC) structured field having an FQN that matches the FQN triplet and immediately precedes the header.

5. The system of claim 1, wherein:
the MOCA header information defines a format for Extensible Markup Language (XML) data within the OCD structured field.

6. The system of claim 5, wherein:
the header information indicates that XML data within the OCD structured field is formatted according to an Extensible Metadata Platform (XMP) standard.

7. The system of claim 1, wherein:
the pointer is one of multiple pointers across multiple OCD structured fields that point to the header.

8. The system of claim 1, wherein:
the header and the OCD structured field are both located within an index for the AFP print data.

9. The system of claim 1, wherein:
the header and the OCD structured field are both located within a document defined by the AFP print data.

10. The system of claim 1, wherein:
the OCD structured field is not bounded by a Begin Object Container (BOC) structured field and End Object Container (EOC) structured field.

11. A system comprising:
a memory configured to store Advanced Function Presentation (AFP) print data; and
a controller configured to load the AFP print data, to detect a Metadata Object Content Architecture (MOCA) object within the print data, to follow a pointer from the MOCA object to a separately stored header that includes header information for multiple MOCA objects, to acquire the header information, which is defined by MOCA specifications, and to process the MOCA object based on the header information within the header.

12. The system of claim 11, wherein:
the header is included within an Object Container Data (OCD) structured field that is distinct from the MOCA object.

13. The system of claim 11, wherein:
the controller is configured to identify the pointer as a Fully Qualified Name (FQN) triplet.

14. The system of claim 13, wherein:
the header is within a master MOCA object; and
the controller is configured identify a Begin Object Container (BOC) structured field within the master MOCA object, wherein the BOC structured field has an FQN that matches the FQN triplet.

15. The system of claim 11, wherein:
the header information defines a format for Extensible Markup Language (XML) data within the MOCA object.

16. The system of claim 15, wherein:
the header information indicates that XML data within the MOCA object is formatted according to an Extensible Metadata Platform (XMP) standard.

17. The system of claim 11, wherein:
the pointer is one of multiple pointers across multiple MOCA objects that point to the header.

18. The system of claim 11, wherein:
the header and the MOCA object are both located within an index for the AFP print data.

19. The system of claim 11, wherein:
the header and the MOCA object are both located within a document defined by the AFP print data.

20. A method comprising:
loading Advanced Function Presentation (AFP) print data from a memory;
detecting an AFP Object Container Data (OCD) structured field storing a MOCA object within the print data;
following a pointer from within the OCD structured field to a separately stored header for the MOCA object that is located outside of the OCD structured field and stores header information for multiple Metadata Object Content Architecture (MOCA) objects;
acquiring the header information, which is defined by MOCA specifications; and
processing the OCD structured field based on the header information within the header.

* * * * *